United States Patent
Marchal et al.

(10) Patent No.: US 9,817,923 B2
(45) Date of Patent: Nov. 14, 2017

(54) PART MADE FROM 3D WOVEN COMPOSITE MATERIAL

(71) Applicant: SNECMA, Paris (FR)

(72) Inventors: Yann Marchal, Melun (FR); Jean-Noel Mahieu, Paris (FR)

(73) Assignee: SNECMA, Paris (FR)

(*) Notice: Subject to any disclaimer, the term of this patent is extended or adjusted under 35 U.S.C. 154(b) by 566 days.

(21) Appl. No.: 14/358,551

(22) PCT Filed: Nov. 12, 2012

(86) PCT No.: PCT/FR2012/052594
§ 371 (c)(1),
(2) Date: May 15, 2014

(87) PCT Pub. No.: WO2013/072606
PCT Pub. Date: May 23, 2013

(65) Prior Publication Data
US 2014/0316547 A1    Oct. 23, 2014

(30) Foreign Application Priority Data
Nov. 15, 2011    (FR) ...................................... 11 60374

(51) Int. Cl.
| G06F 17/50 | (2006.01) |
| G01B 11/24 | (2006.01) |
| B29C 70/24 | (2006.01) |

(52) U.S. Cl.
CPC .............. *G06F 17/50* (2013.01); *B29C 70/24* (2013.01); *G01B 11/24* (2013.01)

(58) Field of Classification Search
CPC .......... G06F 17/50; G01B 11/24; B29C 70/24
See application file for complete search history.

(56) References Cited

U.S. PATENT DOCUMENTS

| 2005/0146076 A1* | 7/2005 | Alexander ........... D03D 1/0088 |
| | | 264/257 |
| 2007/0092379 A1 | 4/2007 | Coupe et al. |

(Continued)

FOREIGN PATENT DOCUMENTS

| EP | 2 327 538 | 6/2011 |
| FR | 2 892 339 | 4/2007 |

OTHER PUBLICATIONS

International Search Report Issued Jan. 21, 2013 in PCT/FR12/052594 filed Nov. 12, 2012.

*Primary Examiner* — Charles E Anya
(74) *Attorney, Agent, or Firm* — Oblon, McClelland, Maier & Neustadt, L.L.P.

(57) ABSTRACT

A method designing a part made of 3D woven composite material, performed by a computer, the method including: obtaining shape data representing an outside surface of the part; for each point of a set of points of the outside surface, determining a distance between the point and a projection of the point onto a target surface, the projection being along a predetermined projection direction; determining a structure of a 3D woven preform as a function of the determined distances; and obtaining projection data specifying a projection direction as a function of a position of a point on the outside surface of the part, wherein the projection direction that is used for at least some of the points of the set of points is determined during the determining a distance, as a function of the projection and as a function of the position of the point.

11 Claims, 3 Drawing Sheets

(56) References Cited

U.S. PATENT DOCUMENTS

2007/0189902 A1\* 8/2007 Mohamed ............... B29C 70/24
　　　　　　　　　　　　　　　　　　　　　416/226
2011/0129348 A1　6/2011 Parkin et al.
2011/0293435 A1\* 12/2011 McMillan ............. B29C 70/222
　　　　　　　　　　　　　　　　　　　　　416/230

\* cited by examiner

PART MADE FROM 3D WOVEN COMPOSITE MATERIAL

BACKGROUND OF THE INVENTION

The present invention relates to the field of parts made of 3D woven composite material. The present invention relates in particular to estimating the thickness to be given to such a part when designing the part.

Document FR 2 892 339 describes fabricating a composite turbine engine blade by using a 3D woven composite material. The main fabrication steps are as follows:

fabricating a mold having an inside surface that corresponds to the outside surface of the blade to be fabricated;

then inserting a 3D woven preform into the mold; and finally injecting resin into the mold and then hardening the resin.

During a prior step of computer-assisted design (CAD), the number of layers in the preform and the shapes of the layer exits in the preform that is to be inserted in the mold are determined, in particular as a function of the shape of the mold. Algorithms exist for performing such calculation. Those known algorithms use as input data a mean profile, also referred to as a skeleton profile, representing the shape of the part that is to be fabricated, in association with a thickness field representing the thickness of the part. On the basis of the shape of the mold, is it therefore necessary to determine the mean profile of the part and the corresponding thickness field.

For that purpose, in the context of fabricating a part made of 2D woven composite material, Document EP 2 327 538 proposes determining the thickness of the blade by projecting a point of its outside surface onto a plane parallel to the root of the blade, in a direction that is normal to the curve defined by the intersection between the above-mentioned plane and the mean profile of the blade.

Nevertheless, the behavior of a 3D woven composite material is different from that of plies of 2D woven material, and it has been observed that estimating thickness in that way is not appropriate and can lead to variations of fiber content, and thus to a part that is not very homogeneous.

Document FR 2 916 529 describes an optical method of measuring the outline of a part. That document does not relate in any way to designing a part made of 3D woven composite material. A passage of that document describes determining the outline of the part, but it makes no mention of a 3D woven preform nor does it make any mention of determining a number of layers or exit positions for such layers.

OBJECT AND SUMMARY OF THE INVENTION

The present invention proposes a method of designing a part made of 3D woven composite material, the design method being performed by a computer and comprising:

a step of obtaining shape data representing the outside surface of the part;

for each point of a set of points of the outside surface, a step of determining a distance between said point and the projection of said point onto a target surface, the projection being along a predetermined projection direction; and a step of determining the structure of a 3D woven preform as a function of the determined distances.

This design method is remarkable in that it also comprises a step of obtaining projection data specifying a projection direction as a function of the position of a point on the outside surface of the part, wherein the projection direction that is used for at least some of the points of the set of points is determined during the step of determining a distance, as a function of said projection and as a function of the position of said point.

As a function of the target surface, the determined distance may correspond to the thickness of the part or to the half-thickness of the part. By using a projection direction as specified by the projection data, e.g. in a predefined file, the determined thickness may be the thickness that is indeed seen by a warp column after the preform has been shaped in the mold. Thus, the determined structure of the preform may take account of deformations to which the preform is subjected on being shaped in the mold. This leads to a fiber content that is more homogeneous.

The projection data may specify a projection direction as a function of the position of said point along a height axis of the part. In a variant, the projection data may specify a projection direction as a function of the position of said point along a height axis of the part and depending on a position along a width axis of the part.

The target surface may be a mean profile of the part.

In another implementation, the outside surface of the part has a first face and a second face opposite to the first face, said set of points being a set of points of the first face and the target surface being the second face.

In another implementation, for at least some of the points of the set of points, during the step of determining a distance, the projection direction that is used is a direction normal to the target surface.

The step of determining the structure of a 3D woven preform may comprise:

a step of calculating the target surface laid flat; and a step of determining a number of layers and exit positions for layers as a function of the calculated flat surface, as a function of the determined distances, and as a function of target weaving parameters.

By way of example, the target weaving parameters are a target fiber content, a target warp/weft ratio, a predetermined weave, a target warp spacing, a target weft spacing, target registering, and a predetermined yarn size.

The invention also provides a method of fabricating a part out of 3D woven composite material, the method comprising:

a step of determining the structure of a 3D woven preform using the design method in accordance with the invention; and a step of fabricating the part as a function of the determined structure.

The fabrication method may comprise:

a step of fabricating a prototype of said part; and a step of storing said projection data as a function of deformations observed in said prototype.

The invention also provides a computer program including instructions for executing a design method in accordance with the invention when said program is executed by a computer.

Finally, the invention also provides a device for designing a part made out of 3D woven composite material, the device comprising:

means for obtaining shape data representing the outside surface of the part;

distance determination means for determining, for each point in a set of points on the outside surface, a distance between said point and the projection of said point onto a target surface, the projection being along a predetermined projection direction; and structure determination means for determining the surface of a 3D woven preform as a function of the determined distances;

the device being characterized in that it further comprises means for obtaining projection data specifying a projection direction as a function of the position of a point on the outside surface of the part, wherein the distance determination means are configured to use as the projection direction for at least some of the points of the set of points, a direction that is determined as a function of said projection data and as a function of the position of said point.

BRIEF DESCRIPTION OF THE DRAWINGS

Other characteristics and advantages of the present invention appear from the following description made with reference to the accompanying drawings, which show an implementation having no limiting character. In the figures.

DETAILED DESCRIPTION OF AN IMPLEMENTATION

Figure 1:
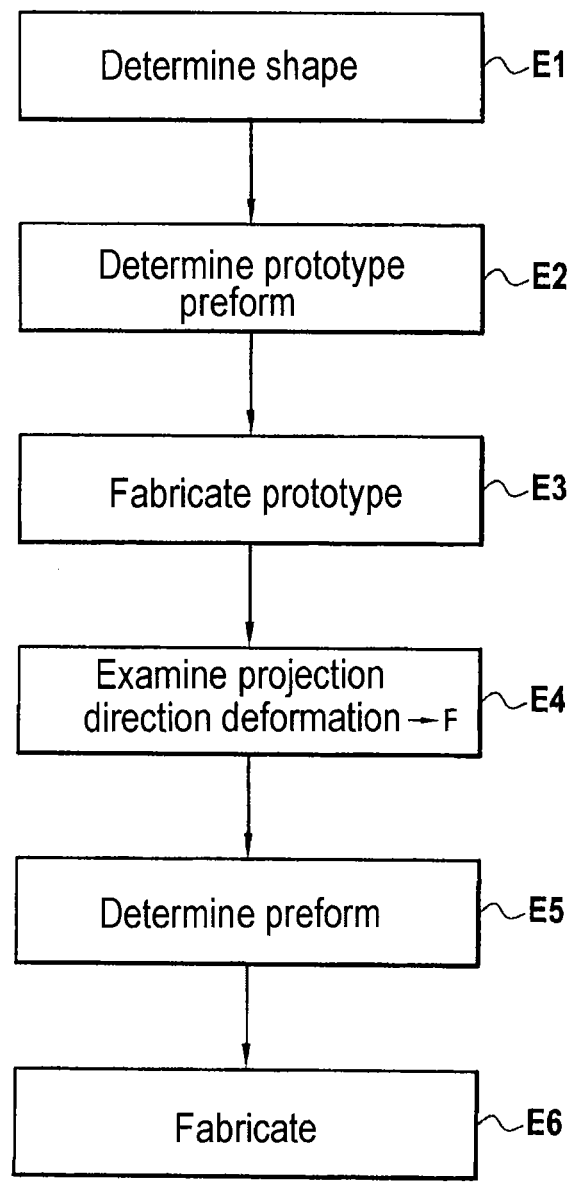
FIG. 1 shows the main steps of a method of fabricating a part made of 3D woven composite material, in an implementation of the invention.

FIG. 1 shows the main steps of a method of fabricating a part out of 3D woven composite material. In the description below, the part is a fan blade for a turbine engine. Naturally, the invention applies to any other part made of 3D woven composite material.

The method begins with a step E1 during which the shape of the blade is determined. Typically, the designer of the part represents the shape of the outside surface of the blade by using CAD software. The shape of the outside surface of the blade is then stored in a file called SHAPE.

Thereafter, in a step E2, the structure of a 3D woven preform is determined that corresponds to the shape of step E1. The person skilled in the art knows methods and software suitable for determining the structure of such a preform, and this step is therefore not described in detail. In one implementation, the step E2 comprises specifically determining a mean profile for the part and a corresponding thickness field, and determining layer exits from the preform as a function of the mean profile and as a function of the determined thickness field. Document EP 2 327 538 mentioned in the introduction gives an example of determining a thickness field that can be used in this step.

By way of example, the positions of the exits of the layers are determined as follows:

starting from the mean profile, a flattening calculation is performed. Since the mean profile comes from the 3D shape of the part and since the weaving is performed on a flat preform, i.e. in 2D, it is necessary to determine the flat shape that corresponds to the 3D shape;

thereafter, the determined thickness field is transferred to the flat shape; and the number of layers and the positions of the layer exits are determined as a function of the thickness field on the flat shape, as a function of a target fiber content and as a function of a target warp/weft ratio. The fiber content is a function of the number of layers, of the weave, of the warp spacing, of the weft spacing, of registering, and of the size of the yarns. Since the other parameters are fixed, it remains to adjust the number of layers in order to obtain the desired fiber content.

A prototype blade is then fabricated in step E3, using the preform structure as determined in step E2. Typically, the step E3 comprises making a mold corresponding to the shape of step E1, 3D weaving the preform as determined in step E2, inserting the preform in the mold, injecting resin into the mold, and hardening the resin. Other fabrication methods may be used.

Thereafter, in a step E4, the deformations of the woven fibers in the prototype blade of step E3 are observed. By way of example, the prototype may be cut up or the deformation of the fibers may be observed by tomography.

The inventors have found that the deformation of the fabric during shaping varies as a function of height within the blade. Thus, in the prototype, the thickness seen by a warp column corresponds to the thickness seen in a direction that results from such varying amounts of deformation, and is not necessarily equal to the thickness that was taken into account when determining the preform in step E2. The fiber content is thus not constant and the blade is thus not homogeneous, which is undesirable.

Thus, in step E4, different projection directions are selected for different heights of the blade, as a function of the observed deformation directions. The selected projection directions are stored in a file F.

Thereafter, in step E5, the structure of a preform is determined for 3D woven composite material as a function of the shape of step E1 and as a function of the projection direction selected in step E4. Step E5 corresponds to a method of designing the part in the meaning of the invention, and it is described below in detail with reference to FIG. 2.

Finally, a blade (or a series of blades) is fabricated in a step E6, using the preform structure as determined in step E5. Like step E3, step E6 typically comprises 3D weaving the preform as determined in step E5, inserting the preform in the mold, injecting resin into the mold, and hardening the resin. Other fabrication methods may be used.

Figure 2:
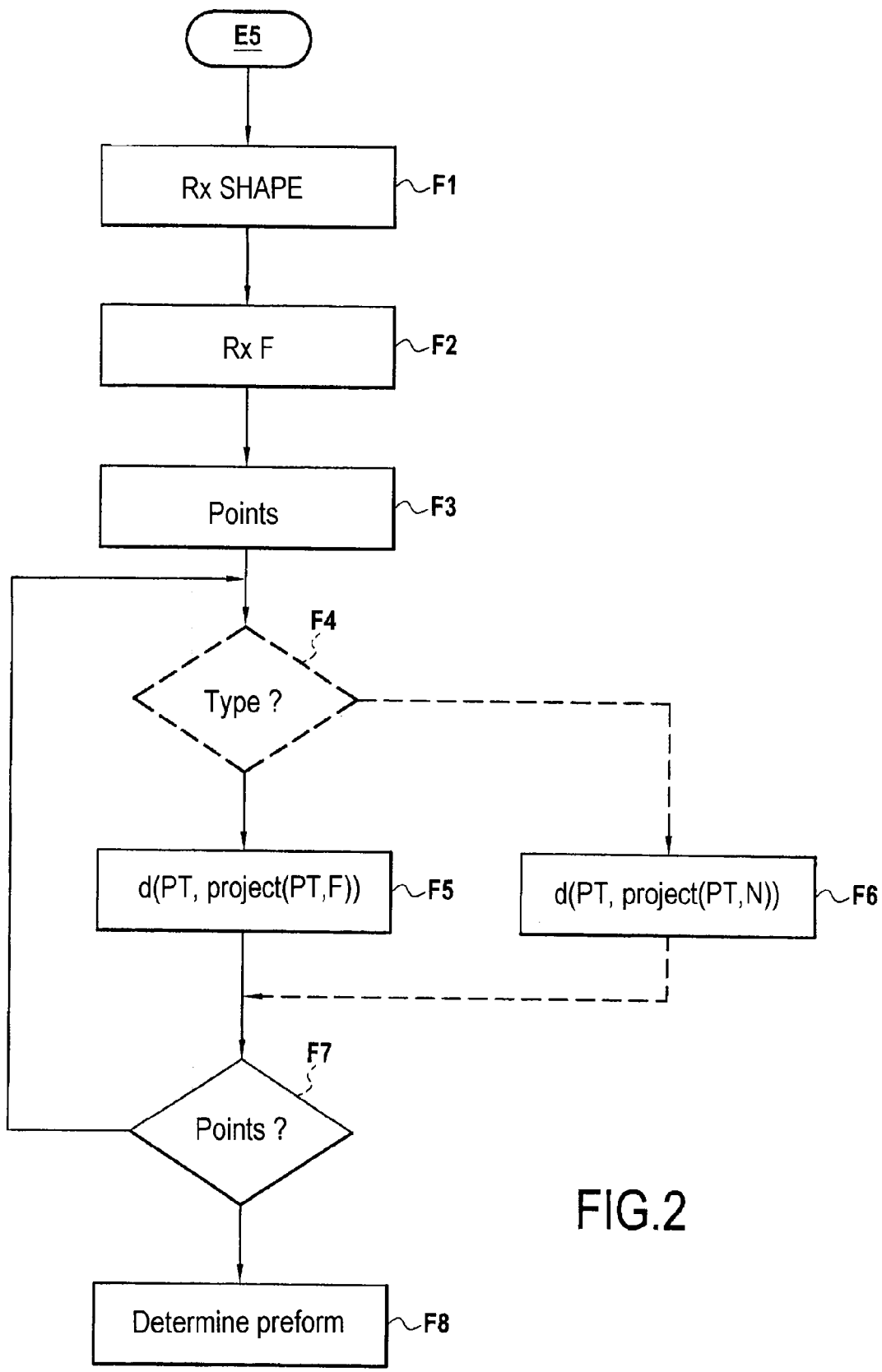
FIG. 2 shows the main steps of the step of determining a preform in FIG. 1.

With reference to FIG. 2, there follows a description in greater detail of the conduct of step E5.

In a step F1, the file SHAPE as mentioned above with reference to step E2 is obtained. In a step F2, the file F as mentioned above with reference to step E4 is obtained.

Thereafter, in a step F3, a set of points on the surface of the blade is selected, e.g. points that are distributed at a constant pitch.

In a step F5, the distance d is determined between a point PT of step F3 and the projection of that point in a predetermined direction onto a target surface.

In one implementation, the target surface is the mean profile of the blade, also referred to as the skeleton profile. The mean profile may for example be defined as the surface defined by the centers of circles inscribed in the volume of the blade, or by points halfway between the two opposite faces of the blade in a predetermined direction.

In another implementation, the points of step F3 are selected on one face of the blade, e.g. its pressure side, and the target surface is the opposite face, e.g. its suction side.

The point PT is projected in step F5 in a projection direction specified by the file F. This is shown in greater detail in FIGS. 3 and 4.

Figure 3:
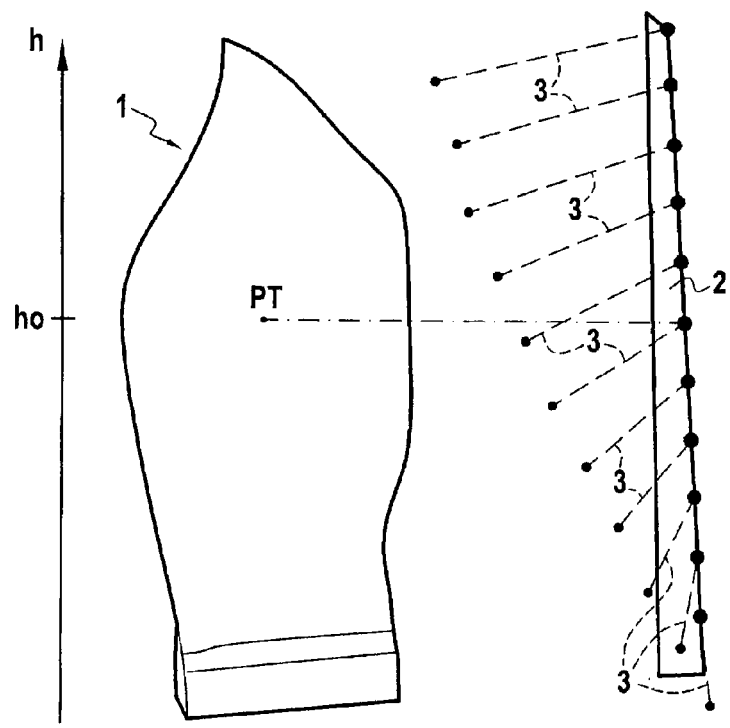
FIG. 3 is a perspective view of a blade showing a point being projected along a projection direction that depends on height.

FIG. 3 shows a blade 1 in a perspective view, and also shows a surface 2. The surface 2 is a graphical illustration of the content of the file F. Thus, the surface 2 may be seen as a twisted rectangular strip that extends parallel to the height axis h f the blade 1. For each height h, the direction 3 normal to the surface 2 represents the projection direction that corresponds to the height in question.

Thus, a point PT situated at a height $h_0$ is projected in step F5 along the corresponding projection direction 3 specified by the surface 2.

Figure 4:
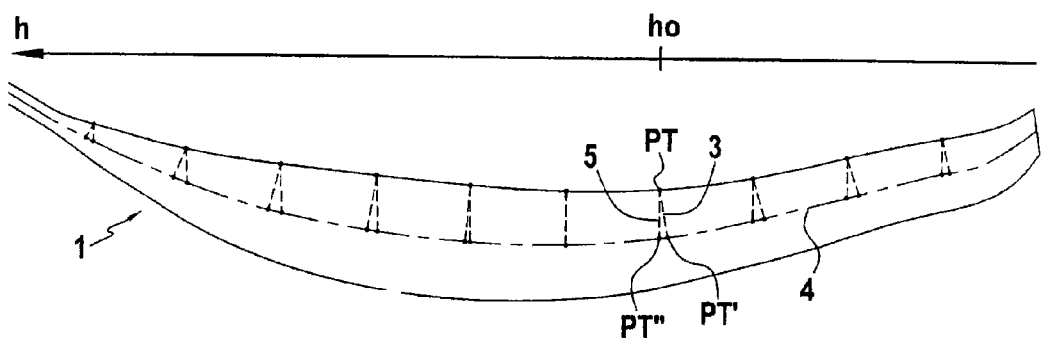
FIG. 4 is a section view of the FIG. 3 blade showing a point being projected along a projection direction that depends on height or along a normal direction.

FIG. 4 is a section view of the blade 1 showing the mean profile 4 of the blade 1. The point PT at height $h_0$ situated on the pressure side of the blade 1 is projected onto the mean profile 4 along the projection direction 3 specified by the surface 2. The projection of the point PT in this direction is written PT'.

The distance d between the points PT and PT' is representative of the half-thickness of the blade 1 in the direction 3.

In an implementation, all of the points selected in step F3 are projected as explained above.

In another implementation, corresponding to the steps shown in dashed lines in FIG. 2, some points are projected as explained above while other points are projected in a direction normal to the target surface (to the mean profile 4 in the example of FIG. 4).

Thus, in this implementation, after step F3 and before step F5, it is determined in a step F4 whether the point PT is a point of the type that is to be projected along a normal direction or along a direction as specified in the file F. By way of example, the type of the point PT is determined as a function of data contained in the file F. For example, the file F contains not only the definition of the surface 2, but also a list of height ranges, and for each range a specification of a type of point.

Depending on the type of point as determined in step F4, the point PT is subjected either to projection as described above in step F5, or else to normal projection in step F6.

The normal projection of step F6 is shown in FIG. 4. The point PT is projected onto the mean profile 4 in a direction 5 that is normal to the mean profile 4. The projection of the point PT in the direction 5 is written PT".

The distance d between the points PT and PT" is representative of the half-thickness of the blade 1 along the direction 5.

Step F5 (or the set of steps F4, F5, F6) is repeated for all of the points of step F3. If in step F7 it is determined that step F5 (or the set of steps F4, F5, F6) has been performed for all of the points of step F3, then the method moves on to step F8.

Finally, in step F8, the structure of a preform for 3D woven composite material and corresponding to that shape of the file SHAPE is determined while taking account of the thickness field represented by the determined distances d.

Figure 5:
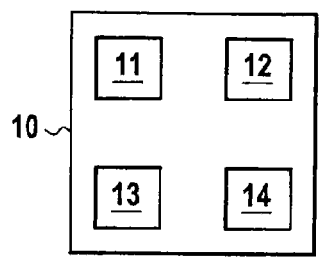
FIG. 5 shows the hardware architecture of a computer enabling the steps of FIG. 2 to be performed.

The steps of FIG. 2 correspond to a method of designing the blade 1 that is performed by a computer. Under such circumstances, the steps of FIG. 2 correspond to executing a computer program. FIG. 5 shows the hardware architecture of a computer 10 enabling the steps of FIG. 2 to be performed.

The computer 10 comprises a processor 11, a non-volatile memory 12, a volatile memory 13, and a user interface 14. The processor 10 serves to execute programs stored in the non-volatile memory 12 while using the volatile memory 13. The user interface 14 enables a user to input data into the computer 10, in particular the data of the above-mentioned file SHAPE and file F. A computer program including instructions for executing steps F1 to F8 is stored in the non-volatile memory 12.

In the above-described implementation, the file F specifies a projection direction as a function of the height h of a point on the surface of the part. In a variant, the projection direction may also vary as a function of the width position of the point on the part. Thus, in general terms, the file F specifies a projection direction as a function of the position of a point.

The invention claimed is:

1. A method of designing a part made of three-dimensional (3D) woven composite material, the design method being performed by a computer, the method comprising:
    obtaining shape data representing an outside surface of the part;
    selecting a set of points of the outside surface of the part;
    for each point of the set of points of the outside surface of the part, obtaining projection data specifying a projection direction as a function of a position of the point along a height axis of the part;
    for each point of the set of points of the outside surface of the part, determining whether a type of point is to be projected along a normal direction;
    in response to the type of point being a point to be projected along the normal direction, projecting the point in the normal direction to the target surface;
    otherwise, projecting the point along a direction as specified in a file;
    for each point of the set of points of the outside surface of the part, determining a distance between the point and a projection of the point onto a target surface along the obtained projection direction, said determined distances forming a determined thickness field representing a thickness of the part; and
    determining a structure of a 3D woven preform as a function of the determined distances and the determined type of point, comprising determining a number of layers and exit position of layers of the preform as a function of said target surface and said determined thickness field.

2. A design method according to claim 1, wherein the projection data specify the projection direction as a function of the position of the point along the height axis of the part and depending on a position along a width axis of the part.

3. A design method according to claim 1, wherein the target surface is a mean profile of the part.

4. A design method according to claim 1, wherein the outside surface of the part includes a first face and a second face opposite to the first face, the set of points being a set of points of the first face and the target surface being the second face.

5. A design method according to claim 1, wherein, for at least some of the points of the set of points, during the determining a distance, the projection direction that is used is a direction normal to the target surface.

6. A design method according to claim 1, wherein the determining the structure of a 3D woven preform comprises:
    calculating the target surface laid flat; and
    determining the number of layers and exit positions for layers as a function of the calculated flat surface, as a function of the determined distances, and as a function of target weaving parameters.

7. A design method according to claim 1, further comprising:
fabricating a prototype of the part; and
storing the projection data as a function of deformations observed in the prototype.

8. A non-transitory computer readable medium including a computer program including instructions for executing a design method according to claim 1 when executed by a computer.

9. A device for designing a part made out of three-dimensional (3D) woven composite material, the device comprising:
means for obtaining shape data representing an outside surface of the part;
means for selecting a set of points of the outside surface of the part;
means for obtaining, for each point of the set of points of the outside surface of the part, projection data specifying a projection direction as a function of a position of the point along a height axis of the part;
means for determining, for each point of the set of points of the outside surface of the part, whether a type of point is to be projected along a normal direction;
means for projecting the point in the normal direction to the target surface, in response to the type of point being a point to be projected along the normal direction;
means for projecting the point along a direction as specified in a file, if the point is not the type of point to be projected along the normal direction; and
structure determination means for determining a surface of a 3D woven preform as a function of the determined distances and the determined type of point, comprising determining a number of layers and exit positions of layers of the preform as a function of said target surface and said determined thickness field.

10. A design method according to claim 1, wherein the target surface is a mean profile defined as center of circles inscribed in a volume of the part made of the 3D woven composite material.

11. A device according to claim 9, wherein the target surface is a mean profile defined as center of circles inscribed in a volume of the part made of the 3D woven composite material.

* * * * *